US010291180B2

(12) United States Patent
Lin

(10) Patent No.: US 10,291,180 B2
(45) Date of Patent: May 14, 2019

(54) CRYSTAL OSCILLATOR CIRCUIT AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 63 days.

(21) Appl. No.: 15/726,651

(22) Filed: Oct. 6, 2017

(65) Prior Publication Data
US 2019/0109563 A1 Apr. 11, 2019

(51) Int. Cl.
H03B 5/36 (2006.01)
H03K 5/08 (2006.01)
H03B 5/32 (2006.01)

(52) U.S. Cl.
CPC ............. *H03B 5/32* (2013.01); *H03B 5/364* (2013.01); *H03K 5/08* (2013.01); *H03B 2200/009* (2013.01)

(58) Field of Classification Search
CPC ... H03B 5/30; H03B 5/32; H03B 5/36; H03B 5/362; H03B 5/364; H03B 5/366; H03B 5/368; H03B 2200/009; H03B 2200/0092; H03K 5/08
USPC ........................................ 331/154, 158, 160
See application file for complete search history.

(56) References Cited

U.S. PATENT DOCUMENTS

| 3,701,028 | A | | 10/1972 | Markevich | |
|---|---|---|---|---|---|
| 3,911,378 | A | * | 10/1975 | Buchanan | H03B 5/32 331/108 C |
| 5,745,012 | A | | 4/1998 | Oka et al. | |
| 6,320,473 | B1 | * | 11/2001 | Leuschner | H03B 5/06 331/116 FE |
| 6,472,945 | B1 | * | 10/2002 | Gumm | H03B 5/24 331/138 |
| 7,683,728 | B2 | * | 3/2010 | Maede | H01L 27/0255 331/116 FE |
| 9,537,449 | B1 | | 1/2017 | Liao et al. | |

(Continued)

FOREIGN PATENT DOCUMENTS

TW 201701583 A 1/2017

OTHER PUBLICATIONS

TW Office Action dated Aug. 6, 2018 in Taiwan application (No. 107115125).

*Primary Examiner* — Levi Gannon
(74) *Attorney, Agent, or Firm* — McClure, Qualey & Rodack, LLP

(57) ABSTRACT

A crystal oscillator comprises: an inverter configured to receive a first voltage at a first node and output a second voltage at a second node; a feedback network inserted between the first node and the second node, wherein the feedback network includes a serial connection of a first feedback resistor, a clamp network, and a second feedback resistor; a first optional resistor inserted between the second node and a third node; a second optional resistor inserted between a fourth node and the first node; a crystal inserted between the third node and the fourth node; a first shunt capacitor inserted between the third node and a ground node; and a second shunt capacitor inserted between the fourth node to and the ground node.

14 Claims, 4 Drawing Sheets

(56) References Cited

U.S. PATENT DOCUMENTS

| | | | |
|---|---|---|---|
| 2003/0020556 A1* | 1/2003 | Kubo | H03L 1/023 |
| | | | 331/158 |
| 2003/0098751 A1* | 5/2003 | Kanno | H03K 3/0307 |
| | | | 331/158 |
| 2004/0189413 A1* | 9/2004 | Satoh | H03B 5/364 |
| | | | 331/158 |
| 2006/0255871 A1* | 11/2006 | Kamiya | H03B 5/364 |
| | | | 331/158 |
| 2008/0266009 A1* | 10/2008 | Liang | H03B 5/364 |
| | | | 331/158 |
| 2014/0104009 A1* | 4/2014 | Lin | H01L 27/0255 |
| | | | 331/116 R |
| 2016/0373060 A1 | 12/2016 | Liao et al. | |

* cited by examiner

CRYSTAL OSCILLATOR CIRCUIT AND METHOD THEREOF

BACKGROUND OF THE DISCLOSURE

Field of the Disclosure

The present disclosure generally relates to crystal oscillator circuits, and more particularly to low-noise crystal oscillator circuits.

Description of Related Art

As shown in FIG. 1, a conventional crystal oscillator circuit 100 includes an inverter 110, a self-biasing feedback resistor 130, a first optional resistor 170, a second optional resistor 160 and a resonant tank 180. The inverter is configured to receive a voltage $V_A$ at node 101 and to output a voltage $V_A$ at node 102. The self-biasing feedback resistor 130 is inserted between node 102 and node 101. The first optional resistor 170 is inserted between node 102 and node 103. The second optional resistor 160 is inserted between node 104 and node 101. The resonant tank 180 includes a crystal 120 inserted between node 103 and node 104, a first shunt capacitor 150 configured to shunt a voltage $V_C$ at node 103 to ground, and a second shunt capacitor 140 configured to shunt a voltage $V_D$ to ground. When the first optional resistor 170 is not used, it is replaced by a short circuit. Likewise, when the second optional resistor 160 is not used, it is replaced by a short circuit. Crystal oscillator circuits 100 are widely used in prior art, are well understood by persons skilled in the art, and thus not described in detail here. An issue in this type of crystal oscillator circuit 100 is that the self-biasing feedback resistor 130 is usually a significant contributor of noise and can adversely degrade circuit performance. Without the self-biasing feedback resistor 130, however, crystal oscillator 100 might fail to oscillate.

BRIEF SUMMARY OF THIS DISCLOSURE

In an embodiment, a crystal oscillator includes an inverter, a feedback network, a first shunt capacitor, a second shunt capacitor and a crystal. The inverter is configured to receive a first voltage at a first node and output a second voltage at a second node. The feedback network is inserted between the first node and the second node, in which the feedback network includes a serial connection of a first feedback resistor, a clamp network, and a second feedback resistor. The crystal is inserted between a third node and a fourth node, in which the third node is coupled to the second node, and the fourth node is coupled to the first node. The first shunt capacitor is inserted between the third node and a ground node, and the second shunt capacitor is inserted between the fourth node to and the ground node.

In an embodiment, a method includes the following steps: incorporating an inverter to amplify a first voltage at a first node into a second voltage at a second node; inserting a crystal between a third node and a fourth node, in which the third node is coupled to the second node, and the fourth node is coupled to the first node; inserting a first shunt capacitor between the third node and a ground node; inserting a second shunt capacitor between the fourth node and the ground node; and inserting a feedback network between the second node and the first node, in which the feedback network includes a serial connection of a first feedback resistor, a clamp network, and a second feedback resistor.

DETAILED DESCRIPTION OF THIS DISCLOSURE

In the following description and claims, the terms "coupled" and "connected," along with their derivatives, may be used. In particular embodiments, "connected" and "coupled" may be used to indicate that two or more elements are in direct physical or electrical contact with each other, or may also mean that two or more elements may be in indirectly electrical contact with each other. The terms "coupled" and "connected" may still be used to indicate that two or more elements cooperate or interact with each other.

The present disclosure is directed to crystal oscillator. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "CMOS (complementary metal oxide semiconductor)," "PMOS (P-channel metal oxide semiconductor) transistor," "NMOS (N-channel metal oxide semiconductor) transistor," "node," "ground," "voltage," "frequency," "phase," "resonant tank," "crystal," "inverter," "common source," and "diode-connected MOS (metal oxide semiconductor) transistor." Terms and basic concepts like these are well known and understood to those of ordinary skill in the art and thus will not be explained in detail here. Those of ordinary skill in the art will also recognize circuit symbols, such as symbols of PMOS transistor and NMOS transistor, and understand what nodes comprise the "source," the "gate," and the "drain" terminals thereof. Likewise, symbols like these will not be separately described herein.

This disclosure is presented from a practical, or engineering, sense, rather than a theoretical, mathematical sense. For instance, a phrase such as "A is equal to B" means "a difference between A and B is smaller than an engineering tolerance," as opposed to requiring a theoretical/mathematical absolute equality.

Figure 2:
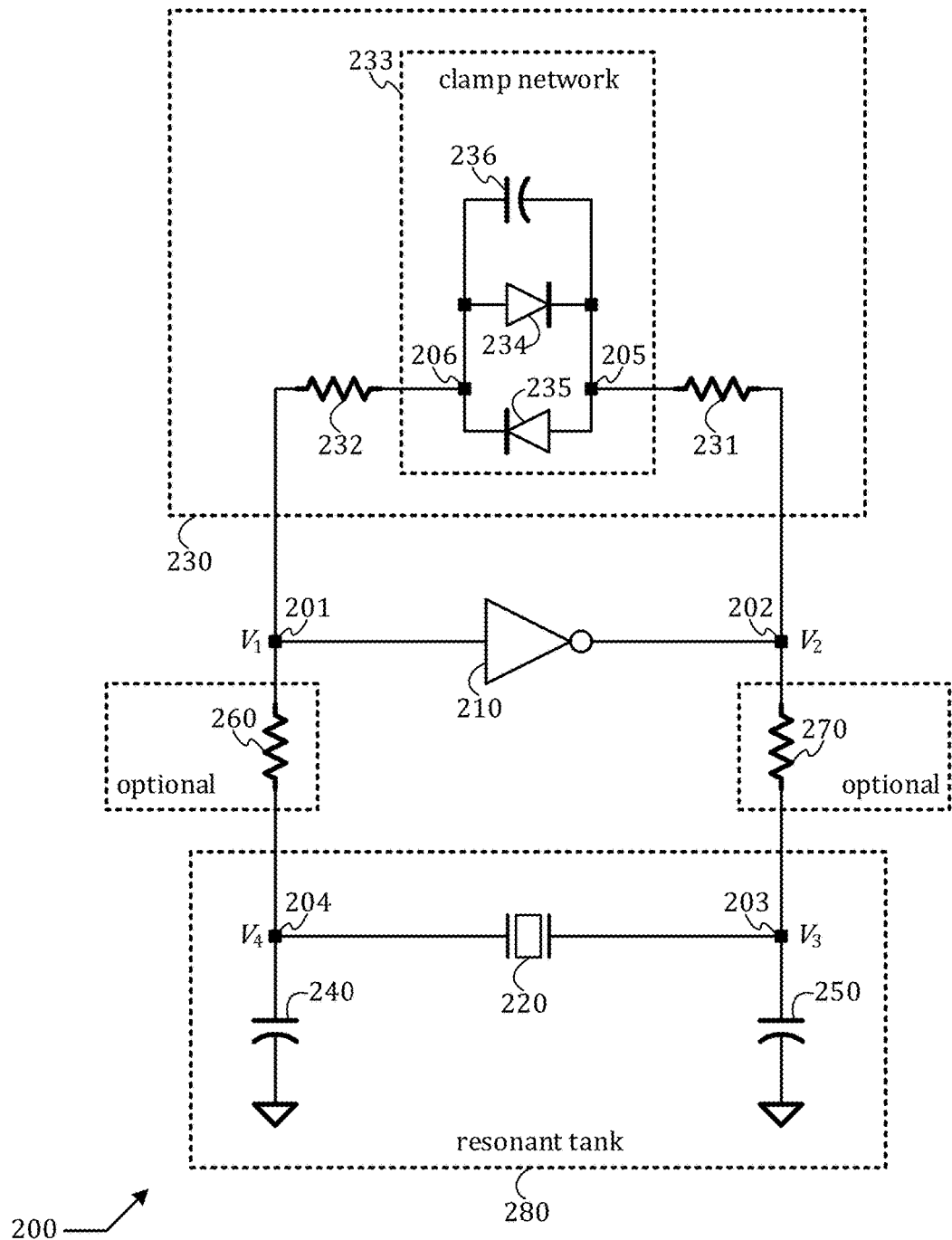
FIG. 2 shows a schematic diagram of a crystal oscillator in accordance with an embodiment of the present disclosure.

A schematic diagram of a crystal oscillator 200 in accordance with an embodiment of the present disclosure is shown in FIG. 2. Crystal oscillator 200 comprises an inverter 210, a feedback network 230, a first optional resistor 270, a second optional resistor 260, and a resonant tank 280. The inverter 210 is configured to receive a first voltage $V_1$ at a first node 201 and to output a second voltage $V_2$ at a second node 202. The feedback network 230 is inserted between the first node 201 and the second node 202. The feedback network 230 comprises a serial connection of a first feedback resistor 231, a clamp network 233, and a second feedback resistor 232. The clamp network 233 comprises a parallel connection of a feedback capacitor 236, a first diode 235 placed in a forward direction, and a second diode 234 placed in a reverse direction. The first optional resistor 270 is inserted between the second node 202 and a third node 203. The second optional resistor 260 is inserted between a fourth node 204 and the first node 201. The resonant tank 280 comprises a crystal 220 inserted between the third node 203 and the fourth node 204, a first shunt capacitor 250 configured to shunt a third voltage $V_3$ at the third node 203 to ground, and a second shunt capacitor 240 configured to shunt a fourth voltage $V_4$ at the fourth node 204 to ground. The first (second) optional resistor 270 (260) is said to be optional, because it can be of zero Ohm resistance at the discretion of a circuit designer. The first optional resistor 270 can be used to attenuate a driving level of the crystal 220. The second optional resistor 260 is used to protect the inverter 210 in case of an electrostatic discharge event.

Figure 1:
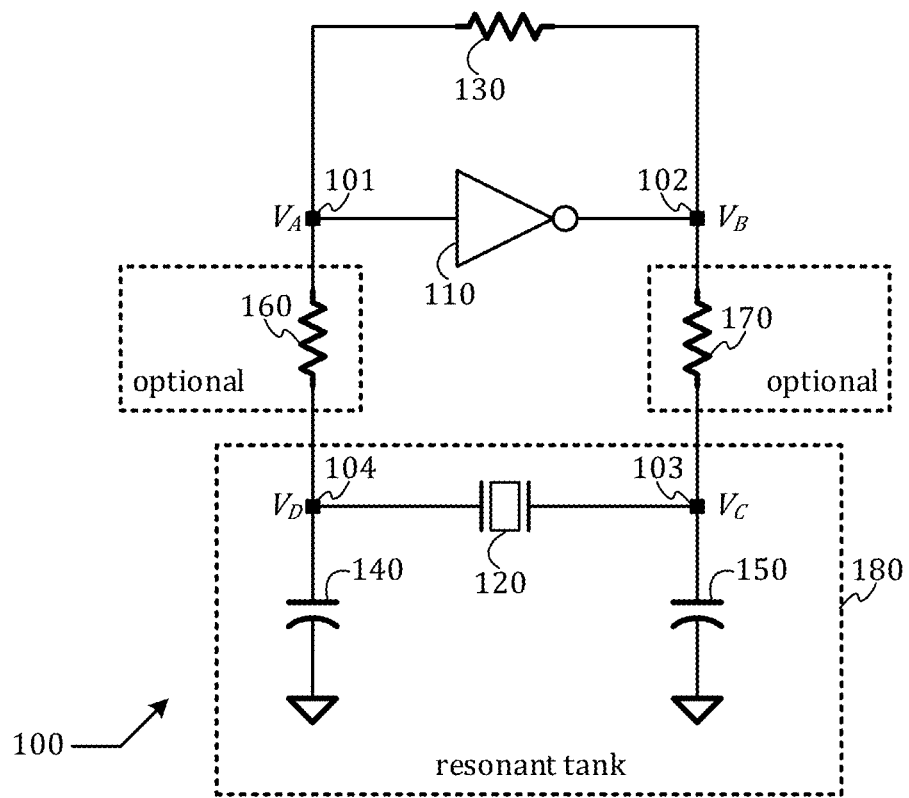
FIG. 1 shows a schematic diagram of a prior art crystal oscillator.
Figure 3:
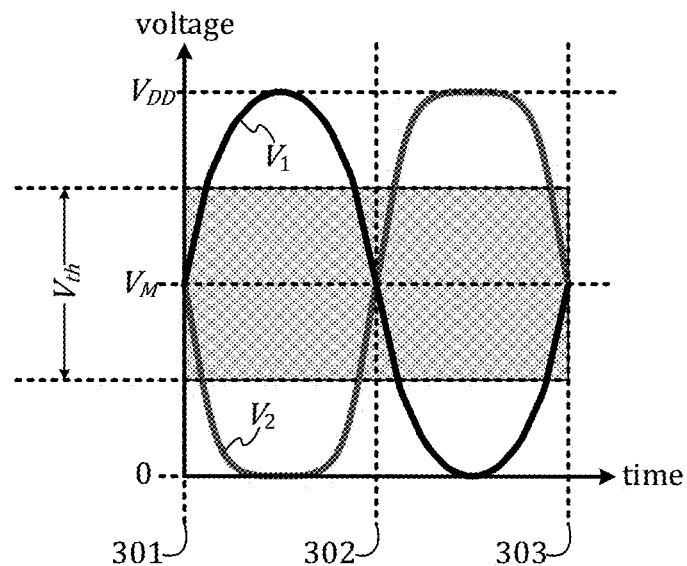
FIG. 3 shows an illustrative waveform of the crystal oscillator of FIG. 2.

Inverter 210 is configured to provide a gain needed to sustain an oscillation. Resonant tank 280 is configured to determine an oscillation frequency, at which the resonant tank 280 provides an approximately 180-degree phase shift that is needed to satisfy an oscillation condition. An output of the oscillation can be tapped from either $V_1$ at the first node 201 or $V_2$ at the second node 202. An exemplary waveform of $V_1$ and $V_2$ over one oscillation cycle is shown in FIG. 3. Here, $V_{DD}$ is a supply voltage for inverter 210, and $V_M$ is a trip point of inverter 210. At time 301, both $V_1$ and $V_2$ are at $V_M$, $V_1$ rises, and $V_2$ falls due to an inversion function of inverter 210. Also, $V_2$ falls more sharply than $V_1$ rises due to a gain of inverter 210. When a difference between $V_1$ and $V_2$ is smaller than a threshold voltage $V_{th}$ of the first diode 235 and the second diode 234, as shown in the shaded region, the clamp network 233 is effectively open, and therefore the feedback network 230 contribute almost no noise. The feedback network 230 starts conducting when the voltage difference between $V_1$ and $V_2$ exceeds the threshold voltage (i.e., outside of the shaded region), and starts contributing some noise. However, crystal oscillator 200 is most susceptible to noise when the oscillation output is small, i.e., $|V_1-V_M|$ is small, and incidentally $|V_2-V_M|$ and $|V_2-V_1|$ are also small, and the feedback network is open. Therefore, the feedback network 230 contributes almost no noise when the crystal oscillator 200 is more susceptible to noise, and the feedback network 230 contributes noise only when the crystal oscillator 200 is more immune to noise. This way, crystal oscillator 200 can have a better performance than the prior art crystal oscillator 100 of FIG. 1.

Figure 4:
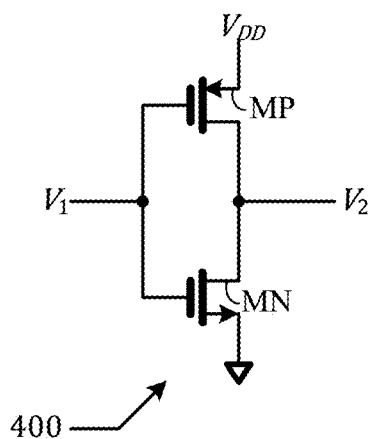
FIG. 4 shows a schematic diagram of an inverter.

A schematic diagram of an inverter 400 suitable for embodying inverter 210 of FIG. 2 is shown in FIG. 4. Inverter 400 comprises a NMOS transistor MN and a PMOS MP transistor configured in a complementary common-source amplifier topology. The inverter 400 is well known to those of ordinary skill in the art and thus not described in detail here.

In some embodiments, $V_{DD}$ is 1.5V. In some embodiments, width and length of NMOS transistor MN are 50 μm and 450 nm, respectively. In some embodiments, width and length of PMOS transistor MP are 125 μm and 450 nm, respectively. In some embodiments, the crystal 220 has a resonant frequency of 40 MHz. In some embodiments, the first shunt capacitor 250 and the second shunt capacitor 240 are both 15 pF. In some embodiments, the first optional resistor 270 is 200 Ohm, the second optional resistor 260 is 40 Ohm, and the first feedback resistor 231 and the second feedback resistor 232 are both 20 KOhm. In some embodiments, the feedback capacitor 236 is 200 fF. In some embodiments, the first diode 235 and the second diode 234 are both embodied by a PMOS transistor configured in a diode-connected topology, in which the width and length of the PMOS transistor are 260 nm and 6 μm, respectively.

"Diode-connected MOS transistor" and that "a diode-connected MOS transistor can be used to embody a diode for clamping a voltage" are well understood to those of ordinary skill in the art and thus not described in detail here.

Figure 5:
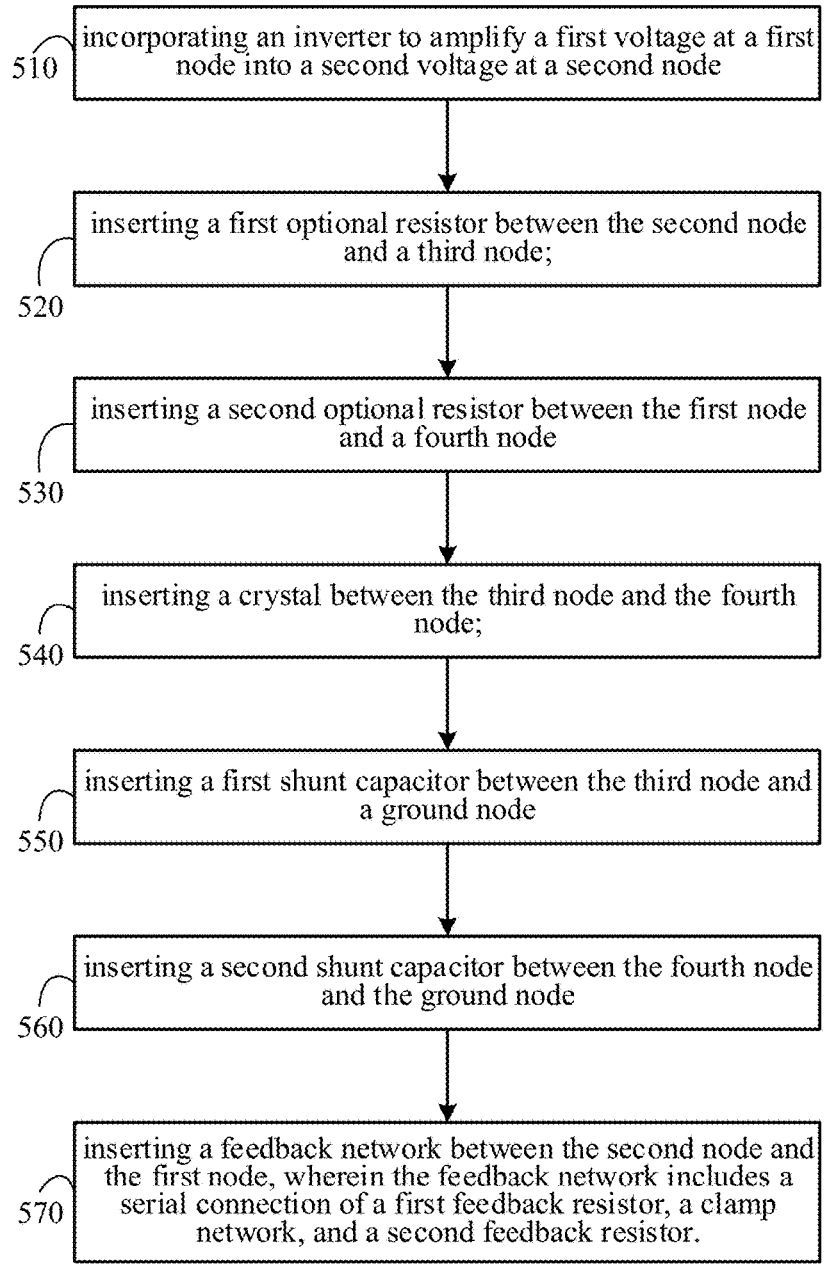
FIG. 5 shows a flow diagram of a method in accordance with the present disclosure.

As shown in a flow diagram 500 depicted in FIG. 5, a method comprises: incorporating an inverter to amplify a first voltage at a first node into a second voltage at a second node (step 510); inserting a first optional resistor between the second node and a third node (step 520); inserting a second optional resistor between the first node and a fourth node (step 530); inserting a crystal between the third node and the fourth node (step 540); inserting a first shunt capacitor between the third node and a ground node (step 550); inserting a second shunt capacitor between the fourth node and the ground node (step 560); inserting a feedback network between the second node and the first node, wherein the feedback network includes a serial connection of a first feedback resistor, a clamp network, and a second feedback resistor (step 570).

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A crystal oscillator comprising:
   an inverter configured to receive a first voltage at a first node and output a second voltage at a second node;
   a feedback network inserted between the first node and the second node, wherein the feedback network includes a serial connection of a first feedback resistor, a clamp network, and a second feedback resistor;
   a crystal inserted between a third node and a fourth node, wherein the third node is coupled to the second node, and the fourth node is coupled to the first node;
   a first shunt capacitor inserted between the third node and a ground node; and
   a second shunt capacitor inserted between the fourth node to and the ground node.

2. The crystal oscillator of claim 1, wherein the crystal oscillator further comprises:
   a first optional resistor inserted between the second node and the third node; and
   a second optional resistor inserted between the fourth node and the first node.

3. The crystal oscillator of claim 1, wherein the clamp network comprises a parallel connection of a first diode placed in a forward direction, a second diode placed in a reverse direction, and a feedback capacitor.

4. The crystal oscillator of claim 1, wherein the inverter comprises a NMOS (n-channel metal oxide semiconductor) transistor and a PMOS (p-channel metal oxide semiconductor) transistor configured in a complementary common-source amplifier topology.

5. The crystal oscillator of claim 3, wherein both the first diode and the second diode comprise a MOS (metal-oxide semiconductor) transistor configured in a diode-connected topology.

6. A method comprising:
incorporating an inverter to amplify a first voltage at a first node into a second voltage at a second node;
inserting a crystal between a third node and a fourth node, wherein the third node is coupled to the second node, and the fourth node is coupled to the first node;
inserting a first shunt capacitor between the third node and a ground node;
inserting a second shunt capacitor between the fourth node and the ground node; and
inserting a feedback network between the second node and the first node, wherein the feedback network includes a serial connection of a first feedback resistor, a clamp network, and a second feedback resistor.

7. The method of claim 6, wherein the method further comprises:
inserting a first optional resistor between the second node and the third node; and
inserting a second optional resistor between the first node and the fourth node.

8. The method of claim 6, wherein the clamp network comprises a parallel connection of a first diode placed in a forward direction, a second diode placed in a reverse direction, and a feedback capacitor.

9. The method of claim 6, wherein the inverter comprises a NMOS (n-channel metal oxide semiconductor) transistor and a PMOS (p-channel metal oxide semiconductor) transistor configured in a complementary common source amplifier topology.

10. The method of claim 8, wherein both the first diode and the second diode comprise a MOS (metal-oxide semiconductor) transistor configured in a diode-connected topology.

11. A crystal oscillator comprising:
an inverter configured to receive a first voltage at a first node and output a second voltage at a second node;
a feedback network inserted between the first node and the second node, wherein the feedback network includes a serial connection of a first feedback resistor, a clamp network, and a second feedback resistor, wherein the clamp circuit is configured to act as an open circuit when the difference between the first voltage and the second voltage is smaller than a predetermined amount;
a crystal inserted between a third node and a fourth node, wherein the third node is coupled to the second node, and the fourth node is coupled to the first node;
a first shunt capacitor inserted between the third node and a ground node; and
a second shunt capacitor inserted between the fourth node to and the ground node.

12. The crystal oscillator of claim 11, wherein the clamp network comprises a parallel connection of a first diode placed in a forward direction, a second diode placed in a reverse direction, and a feedback capacitor.

13. The crystal oscillator circuit of claim 11, further comprising a first resistor interposed between the second node and a third node.

14. The crystal oscillator circuit of claim 12, further comprising a second resistor interposed between a fourth node and the first node.

* * * * *